United States Patent
Oishi

(10) Patent No.: US 8,809,077 B2
(45) Date of Patent: Aug. 19, 2014

(54) METHOD OF MANUFACTURING SEMICONDUCTOR DEVICE

(75) Inventor: Amane Oishi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 234 days.

(21) Appl. No.: 13/421,320

(22) Filed: Mar. 15, 2012

(65) Prior Publication Data
US 2013/0001549 A1   Jan. 3, 2013

(30) Foreign Application Priority Data

Jul. 1, 2011   (JP) .................................. 2011-147662

(51) Int. Cl.
  *H01L 21/66*   (2006.01)
  *G01R 31/26*   (2014.01)
(52) U.S. Cl.
  USPC ....... 438/18; 438/682; 438/592; 257/E21.524
(58) Field of Classification Search
  CPC .......... H01L 22/20; H01L 22/34; H01L 22/14
  USPC .......................................... 438/18, 682, 592
  See application file for complete search history.

(56) References Cited

U.S. PATENT DOCUMENTS

| | | | | |
|---|---|---|---|---|
| 4,091,527 | A * | 5/1978 | Goodman et al. | 438/17 |
| 4,701,422 | A * | 10/1987 | Elliott | 438/17 |
| 6,249,138 | B1 * | 6/2001 | Huang et al. | 324/762.08 |
| 7,325,224 | B2 | 1/2008 | Seltmann et al. | |
| 7,932,105 | B1 * | 4/2011 | Saxena et al. | 438/17 |
| 2004/0063225 | A1 * | 4/2004 | Borden et al. | 438/7 |
| 2006/0183290 | A1 * | 8/2006 | Kamada et al. | 438/300 |
| 2007/0048883 | A1 * | 3/2007 | Lehr et al. | 438/14 |
| 2010/0301331 | A1 * | 12/2010 | Patterson et al. | 257/48 |
| 2012/0119778 | A1 * | 5/2012 | Ahsan et al. | 324/762.09 |

FOREIGN PATENT DOCUMENTS

| | | |
|---|---|---|
| JP | 2-132824 | 5/1990 |
| JP | 5-114570 | 5/1993 |
| JP | 2005-251954 | 9/2005 |

* cited by examiner

*Primary Examiner* — Steven J Fulk
(74) *Attorney, Agent, or Firm* — Oblon, Spivak, McClelland, Maier & Neistadt, L.L.P.

(57) ABSTRACT

In a method of manufacturing of a semiconductor device according to an embodiment, an inspection transistor is subjected to silicidation and subsequently a characteristic of the inspection transistor is measured after the inspection transistor and a product transistor on a substrate are subjected to an annealing process. Thereafter, based on the measured characteristic, a characteristic adjustment annealing process to make a characteristic of the product transistor close to a desired characteristic is performed, and then the product transistor is subjected to silicidation.

9 Claims, 9 Drawing Sheets

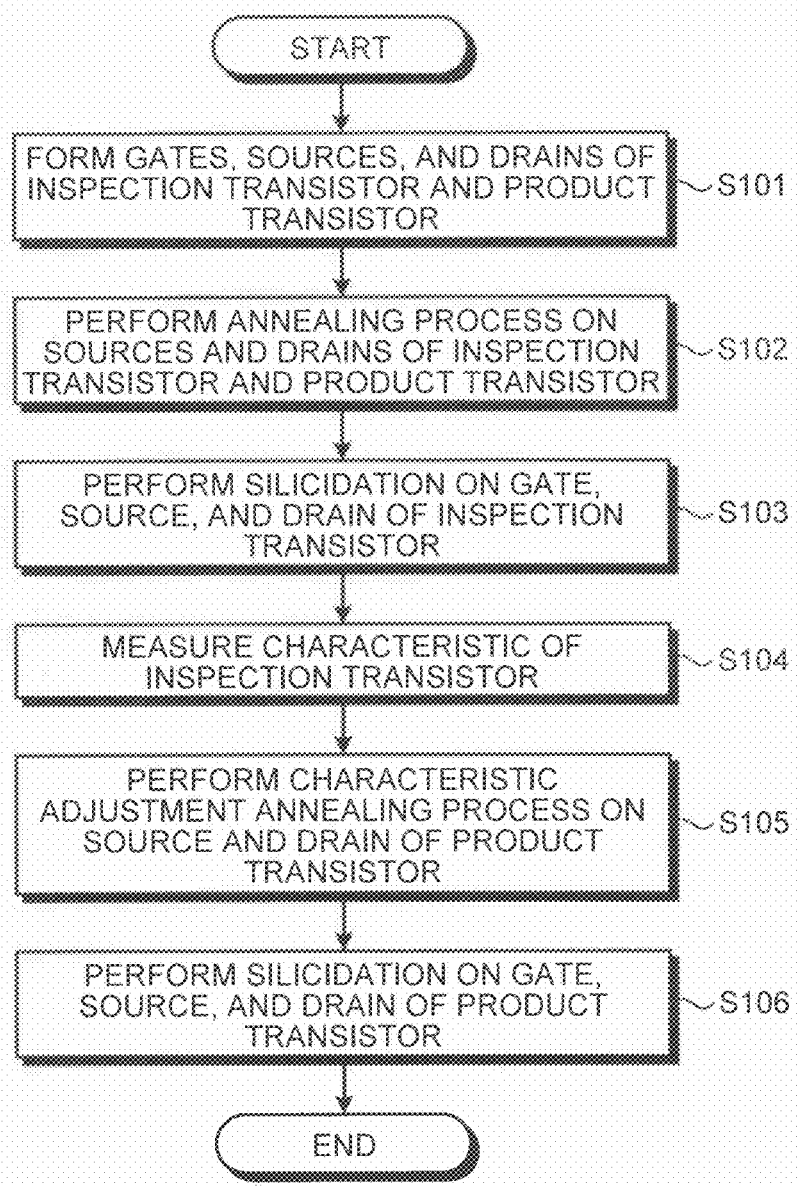

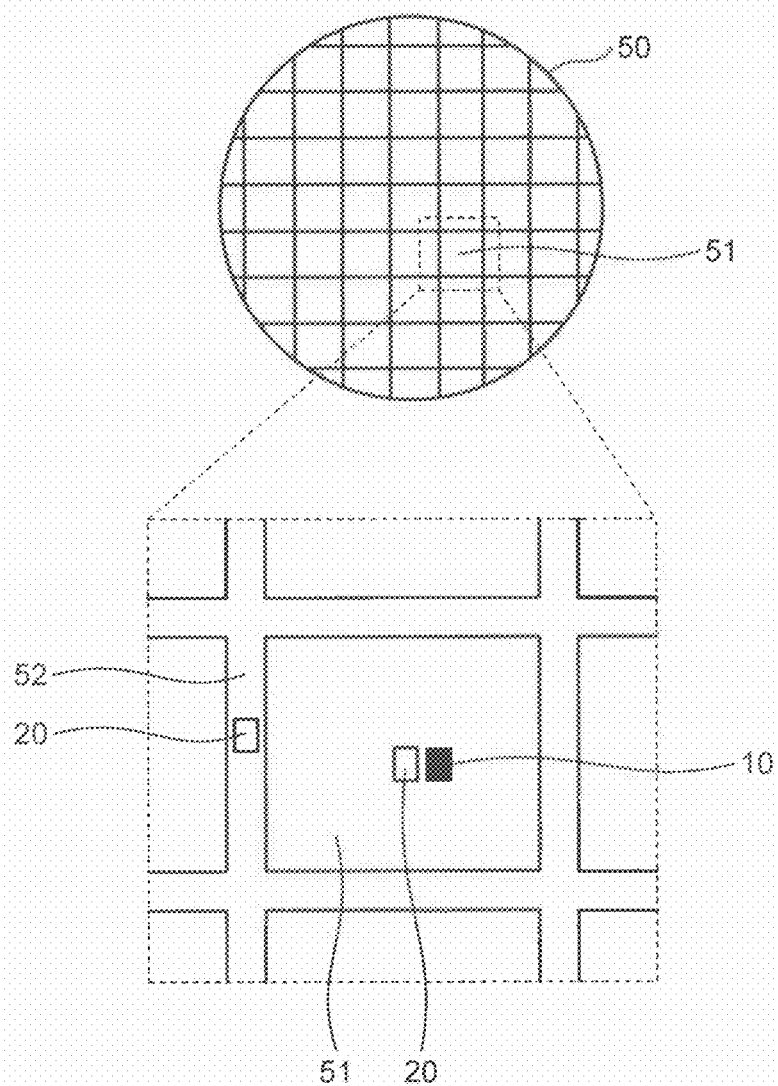

METHOD OF MANUFACTURING SEMICONDUCTOR DEVICE

CROSS-REFERENCE TO RELATED APPLICATIONS

This application is based upon and claims the benefit of priority from Japanese Patent Application No. 2011-147662, filed on Jul. 1, 2011; the entire contents of which are incorporated herein by reference.

FIELD

Embodiments disclosed herein relate generally to a method of manufacturing a semiconductor device and a semiconductor device.

BACKGROUND

Conventionally, when a plurality of semiconductor devices each comprising a field effect transistor were manufactured, there was a variation in the characteristics of the field effect transistors, which results in a reduction in the production yield of the semiconductor devices.

Therefore, many methods of manufacturing a semiconductor device that can suppress the variation in the characteristics of the field effect transistors have been suggested so far, but all of the suggested manufacturing methods still have room for improvement in terms of the production yield.

BRIEF DESCRIPTION OF THE DRAWINGS

FIG. 1 is a flowchart illustrating a manufacturing process of a semiconductor device according to an embodiment.

FIG. 4 is a diagram illustrating an arrangement of a transistor for inspection and a transistor for product according to the embodiment.

DETAILED DESCRIPTION

Figure 2A:
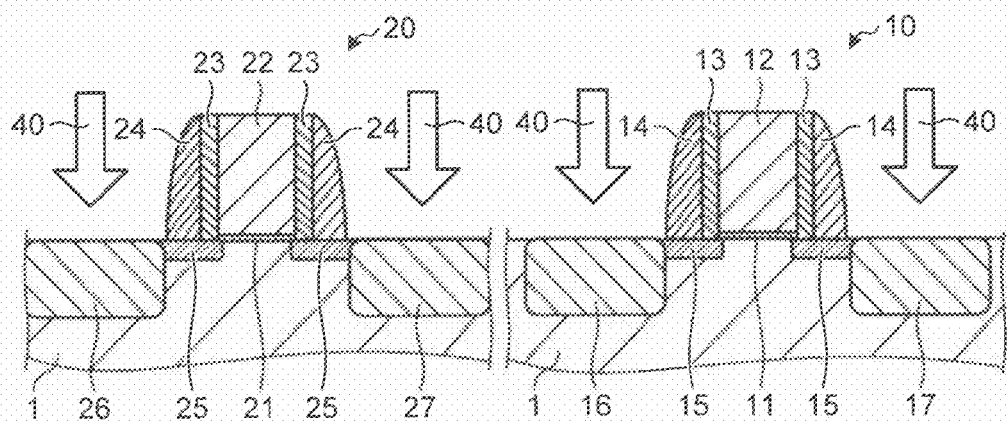
FIGS. 2A to 2D and 3A to 3D are schematic cross-sectional views illustrating the manufacturing process of a semiconductor device according to the embodiment.

An embodiment provides a method of manufacturing a semiconductor device. The method of manufacturing a semiconductor device includes (A) performing an annealing process that activates a source and a drain of an inspection transistor and a source and a drain of a product transistor, both of which are formed on a semiconductor substrate; (B) performing silicidation on a gate, the source, and the drain of the inspection transistor having undergone the (A) performing; (C) measuring a characteristic of the inspection transistor having undergone the (B) performing; (D) performing a characteristic adjustment annealing process that makes a characteristic of a product transistor close to a desired characteristic, based on a difference between the desired characteristic and the characteristic measured by the (C) measuring; and (E) performing silicidation on a gate, the source, and the drain of the product transistor having undergone the (D) performing.

Hereinbelow, a method of manufacturing a semiconductor device according to an embodiment, and a semiconductor device manufactured by the same manufacturing method will be described in detail with reference to the accompanying drawings. The present invention is not limited to the following embodiments. Moreover, a method of manufacturing a part of a Metal Oxide Semiconductor Field Effect Transistor (MOSFET) as the semiconductor device is described below.

FIG. 1 is a flowchart illustrating a manufacturing process of a semiconductor device according to an embodiment. As illustrated in FIG. 1, in the method of manufacturing a semiconductor device according to the embodiment, first of all, each gate, each source, and each drain of a MOSFET for inspection and a MOSFET for product are formed at predetermined positions on a semiconductor substrate such as a silicon wafer (Step S101).

Hereinbelow, the MOSFET for inspection is referred to as "inspection transistor" and the MOSFET for product is referred to as "product transistor". Details of a method of forming the inspection transistor and the product transistor are described below using FIGS. 2A to 2D and 3A to 3D.

An annealing process is performed for each source, drain and gate of the inspection transistor and the product transistor by momentarily irradiating a laser beam to the sources and the drains of the inspection transistor and the product transistor (Step S102). At this time, the laser beam of relatively weak power is irradiated compared when the characteristics of the inspection transistor and the product transistor are made to become desired characteristics. Here, the desired characteristic is a characteristic required for the product transistor to serve as a final product.

Subsequently, a first salicide process (hereafter, referred to as "an inspection salicide process") is performed to subject a gate, the source, and the drain of the inspection transistor to silicidation (Step S103), and then the characteristic of the inspection transistor is measured (Step S104). In addition, details of the characteristic of the inspection transistor which is measured at that time will be described below using FIGS. 5A and 5B.

Subsequently, based on a difference between the characteristic of the inspection transistor measured in Step S104 and the desired characteristic, a characteristic adjustment annealing process is performed on the source, drain and gate of the product transistor in order to make the characteristic of the product transistor close to the desired characteristic (Step S105).

Subsequently, the second salicide process (hereafter, referred to as "main salicide") is performed to subject a gate, the source, and the drain of the product transistor to silicidation (Step S106), so that manufacturing of the product transistor is completed. Thereafter, although not illustrated here, a wiring layer, an interlayer dielectric film, and the like for connecting the product transistor to other circuit elements formed on the semiconductor substrate are formed, and cutting along a predetermined dicing line is performed in units of a chip, so that the method of manufacturing a semiconductor device is completed.

Thus, in the method of manufacturing a semiconductor device according to the embodiment, since the characteristic of the inspection transistor is measured after performing the inspection salicide process on the inspection transistor which already has undergone the annealing process, the characteristic of the inspection transistor which is close to that of the final product can be measured.

Unlike this process, when the characteristic of the inspection transistor is measured, for example, before performing the silicidation of the gate, the source, and the drain after performing the annealing process, the characteristic changes thereafter by the heat-treatment performed during the silicidation of the gate, the source, and the drain.

Therefore, when the characteristic of the inspection transistor is measured after performing the annealing process, it is difficult to measure the characteristic of the inspection transistor that is close to that of the final product in which a change in the characteristic due to the salicide process is taken into consideration.

Moreover, when the characteristic of the inspection transistor which has not undergone the inspection salicide process is inspected by probing, it is difficult to measure a correct numerical value because a contact resistance between an inspection probe and the gate, the source, or the drain is high.

In addition, it is generally hard to take additional anneal process for adjustment after forming silicide because of its poor thermal immunity.

Accordingly in the method of manufacturing a semiconductor device according to the embodiment, the characteristic of the inspection transistor is measured after performing the inspection salicide process, and then the characteristic adjustment annealing process is performed on the product transistor under processing conditions set by adding or subtracting a difference between the measured characteristic and the desired characteristic, so that the characteristic of the product transistor becomes close to the desired characteristic.

As a result, the characteristic of the product transistor can be made close to the desired characteristic by the method of manufacturing a semiconductor device according to the embodiment, compared with a case in which the processing conditions for performing the characteristic adjustment annealing process are determined based on the characteristic of the inspection transistor which has only undergone the annealing process.

Therefore, according to the method of manufacturing a semiconductor device of the embodiment, since a variation in the characteristic of the product transistors in the manufactured semiconductor device may be suppressed, the production yield of the semiconductor devices can be improved.

The method of manufacturing a semiconductor device according to the embodiment is described in more detail by using FIGS. 2A to 2D and 3A to 3D. FIGS. 2A to 2D and 3A to 3D are schematic cross-sectional views illustrating a manufacturing process of a semiconductor device according to the embodiment. FIGS. 2A to 2D and 3A to 3D illustrate a process of forming the inspection transistor 20 and the product transistor 10 of the semiconductor device but does not illustrate a process of forming other circuit elements.

In the method of manufacturing a semiconductor device according to the embodiment (hereafter, referred to as "the present manufacturing method"), a gate 22, a source 26, and a drain 27 of the inspection transistor 20 are formed at predetermined positions on a semiconductor substrate 1 such as a silicon wafer as illustrated in FIG. 2A. For this case, in the present manufacturing method, a gate 12, a source 16, and a drain 17 of the product transistor 10 are formed at predetermined positions of the semiconductor substrate 1 at the same time as the formation of the inspection transistor 20.

Specifically, gate oxide films 21 and 11 formed of a silicon oxide and having a predetermined shape are formed at predetermined positions on the semiconductor substrate 1 formed of silicon and doped with impurities of N type such as phosphorus ions. Subsequently gates 22 and 12 formed of polysilicon are formed on the gate oxide films 21 and 11.

Subsequently, side wall spacers 23 and 13 formed of a silicon oxide are formed on side surfaces of the gates 22 and 12, followed by ion implantation of halo(Ntype) and LDD (Ptype), and impurities 40 of P type (for example, boron ions) are implanted into the positions defined by the side wall spacers 23 and 13.

Subsequently, the side walls 24 and 14 formed of a silicon oxide are formed on side surfaces of the side wall spacers 23 and 13, and impurities 40 of P type (for example, boron ions) are implanted into the positions defined by the side walls 24 and 14. Inspection transistors can be NFETs though description above is a case of using PFETs.

For this case, the impurities 40 are implanted with higher energy than the energy used when the LDD regions 25 and 15 are formed, so that sources 26 and 16, and drains 27 and 17 are formed by ion implantation.

For the sake of convenience here, the transistors illustrated in FIG. 2A are referred to as the inspection transistor 20 and the product transistor 10, but these transistors (the inspection transistor 20 and the product transistor 10) are incomplete transistors, and may become complete final products by undergoing respective processes to be described below.

Figure 2B:
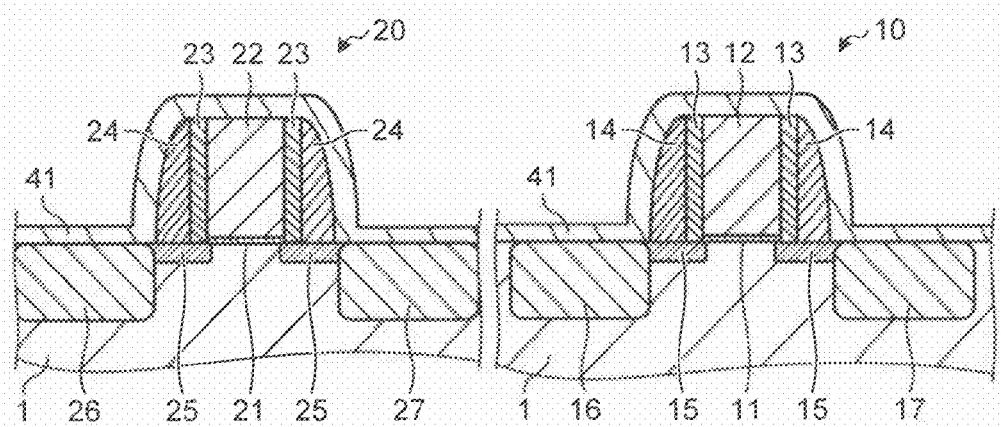
Figure 2C:
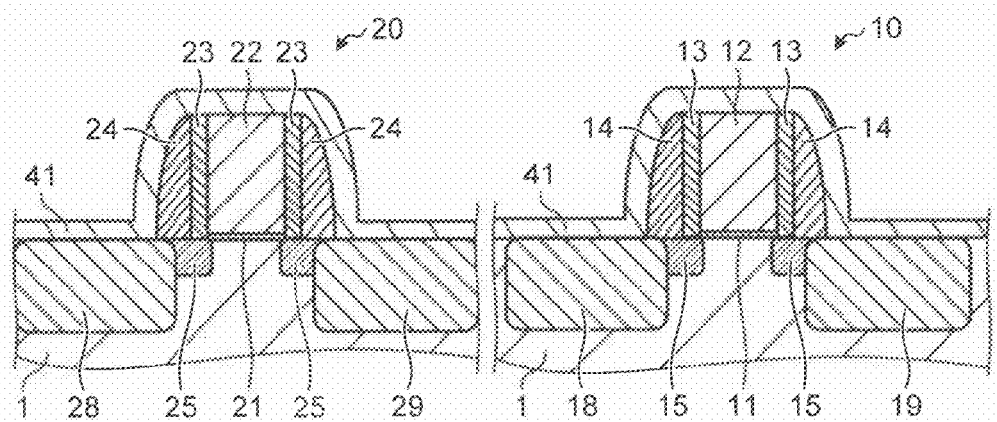

In the present manufacturing method, subsequently, after a silicon oxide film 41 is formed to cover the upper surfaces of the product transistor 10 and the inspection transistor 20 as shown in FIG. 2B, an annealing process is performed. As a result, the impurities 40 in the sources 26 and 16, the drains 27 and 17, and the LDD regions 25 and 15 shown in FIG. 2B diffuse in the direction of depth and toward channel region of the semiconductor substrate 1 as shown in FIG. 2C, so that activated sources 28 and 18 and drains 29 and 19 are formed.

At this time, in the present manufacturing method, an annealing process is performed by any one of spike annealing, flash annealing, and laser annealing. At this time, the "power of the laser for performing the annealing process" (hereafter, referred to as "annealing process power") is set to be relatively weak annealing process power compared to when the characteristics of the inspection transistor 20 and the product transistor 10 are made to become the desired characteristic after the inspection salicide process is performed.

The characteristics of the inspection transistor 20 and the product transistor 10 may be threshold voltages and drain currents of the inspection transistor 20 and the product transistor 10. Moreover, the threshold voltages are voltage values of the gates 22 and 12 at the time when a current begins to flow between the sources 28 and 18 and the drains 29 and 19 with a predetermined potential difference developed between the sources 28 and 18 and the drains 29 and 19, respectively. Moreover, the drain current here is a current value that flows between the sources 28 and 18 and the drains 29 and 19, respectively with a predetermined voltage applied to each of the gates 22 and 12.

Figure 2D:
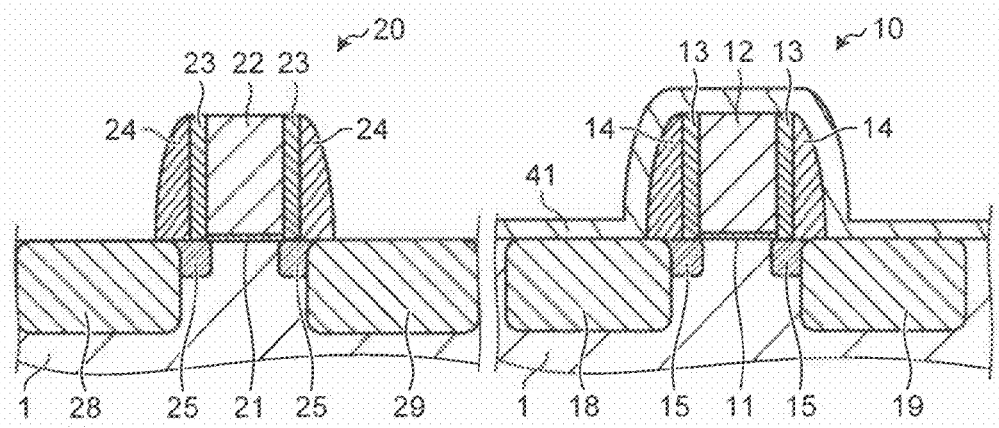

Subsequently, as illustrated in FIG. 2D, among the silicon oxide films 41 formed on the inspection transistor 20 and on the product transistor 10, the silicon oxide film 41 formed on the inspection transistor 20 is selectively removed, and then the inspection salicide process is performed.

Figure 3A:
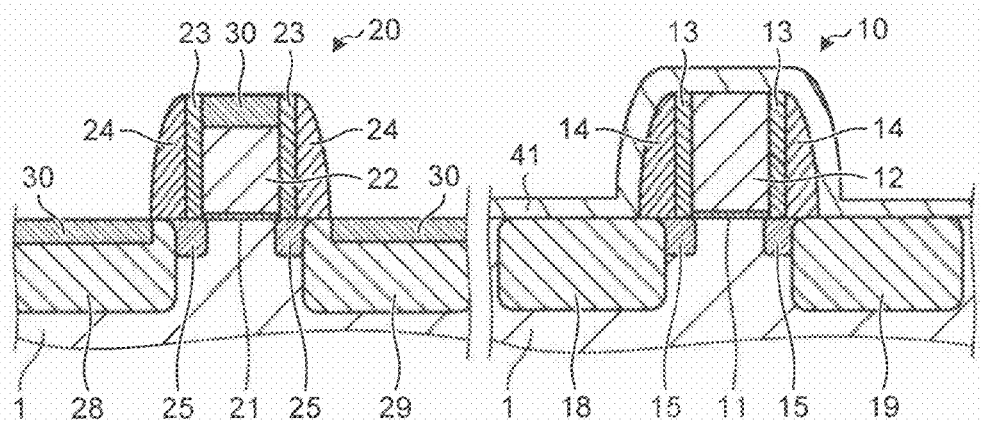

Specifically, a metal film based on titanium, cobalt, platinum or nickel (not illustrated in the figure) is formed using a sputtering technique on the inspection transistor 20 and the product transistor 10, and is then heat-treated at a predetermined temperature. As a result, the upper surface portions of the gate 22, the source 28, and the drain 29 of the inspection transistor 20 are subjected to silicidation as illustrated in FIG. 3A, so that a silicide layer 30 is formed.

At this time, since the silicon oxide film 41 is interposed between the upper surface of the product transistor 10 and the lower surface of the metal film, the silicide layer 30 is not formed on the gate 12, the source 18, and the drain 19 of the product transistor 10.

Subsequently, the characteristic of the inspection transistor 20 is measured in the present manufacturing method. At this time, the threshold voltage of the inspection transistor 20 is measured as one of the characteristics of the inspection transistor 20. Alternatively, at this time, the drain current of the inspection transistor 20 may be measured as one of the characteristics of the inspection transistor 20.

Here, the inspection transistor 20, in which the silicide layer 30 is formed on the upper surface portions of the gate 22, the source 28, and the drain 29, is in an almost completely manufactured state. Therefore, according to the present manufacturing method, the threshold voltage of the inspection transistor 20 which is almost completely manufactured as the final product can be measured.

Moreover, as described above, in the present manufacturing method, the annealing process is performed with annealing process power weaker than that used when the characteristics of the inspection transistor 20 and the product transistor 10 are made to become the desired characteristics after the inspection salicide process is performed. Therefore, a higher threshold voltage than the desired threshold voltage is measured here. In the case of measuring the drain current, a smaller drain current than a desired drain current is measured.

Accordingly, in the present manufacturing method, the characteristic adjustment annealing process which makes the characteristic of the product transistor 10 obtained after performing the main salicide process close to the desired characteristic is performed based on the difference between the desired characteristic required for the product transistor 10 and the measured characteristic of the inspection transistor 20.

Figure 3B:
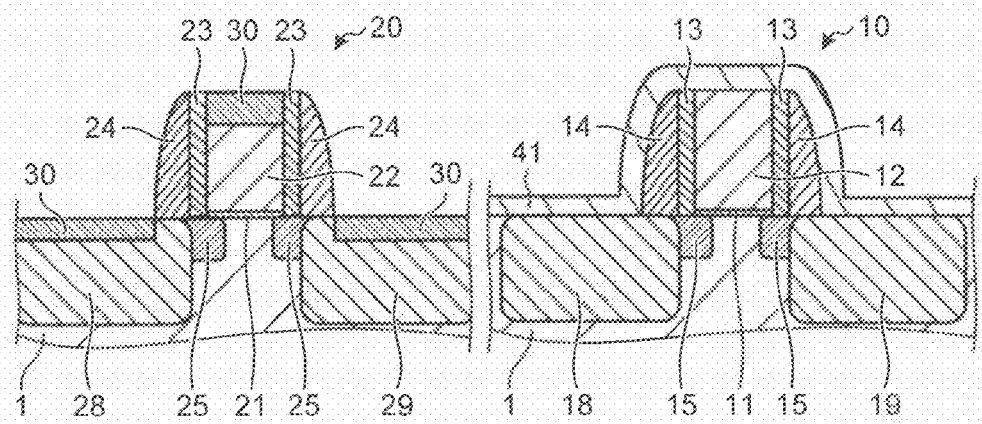

As a result, as illustrated in FIG. 3B, the impurities 40 in the sources 28 and 18, the drains 29 and 19, and the LDD regions 25 and 15 diffuse deeper in the direction of depth and are spread toward channel region of the semiconductor substrate 1 than the state illustrated in FIG. 3A.

Figure 3C:
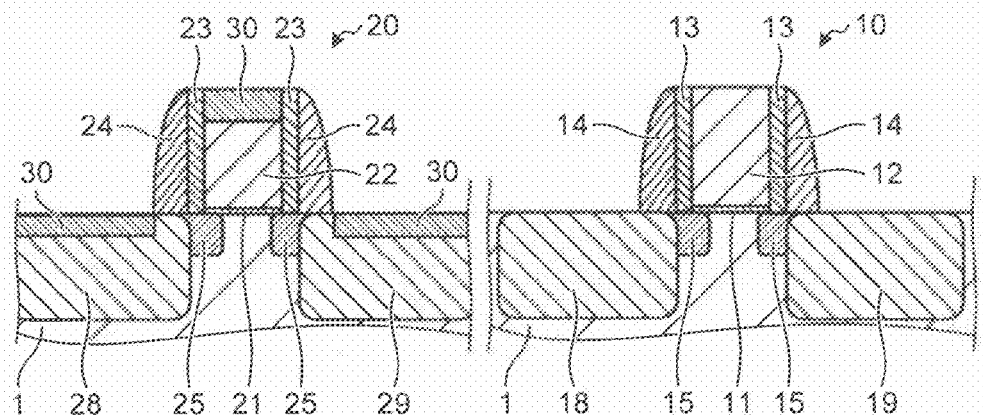

Subsequently, in the present manufacturing method, as illustrated in FIG. 3C, the silicon oxide film 41 that remains on the product transistor 10 is removed and then the main salicide process is performed. That is, a metal film of titanium, cobalt, or the like (not illustrated) is formed using a sputtering technique on the inspection transistor 20 and the product transistor 10, and it is then heat-treated at a predetermined temperature.

Figure 3D:
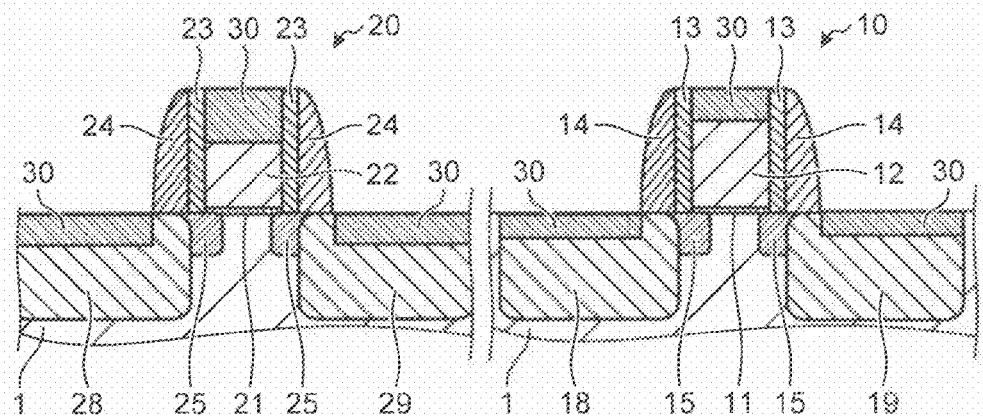

As a result, as illustrated in FIG. 3D, upper surface portions of the gate 12, the source 18, and the drain 19 of the product transistor 10 are subjected to silicidation, so that a silicide layer 30 is formed. At this time, since the silicidation of the gate 22, the source 28, and the drain 29 progresses also in the inspection transistor 20, the silicide layer 30 expands in the direction of depth of the gate 22, the source 28, and the drain 29, so that the thickness of the silicide layer 30 of the inspection transistor 20 is thicker than that of the product transistor 10.

Thereafter, a wiring layer, an interlayer dielectric film, and the like for connecting the product transistor 10 to other circuit elements formed on the semiconductor substrate are formed, and cutting along a predetermined dicing line is performed in units of a chip, so that the method of manufacturing a semiconductor device is completed.

Thus, in the present manufacturing method, since the characteristic of the inspection transistor 20 is measured after forming the silicide layer 30 on the upper surface portions of the gate 22, the source 28, and the drain 29 of the inspection transistor 20, the threshold voltage of the inspection transistor 20 which is an approximate final product can be measured.

As a result, the annealing process power for performing the characteristic adjustment annealing process which needs to be performed to make the threshold voltage of the product transistor 10 close to the desired threshold voltage can be calculated after the main salicide process is performed, based on the difference between a measured threshold voltage of the inspection transistor 20 and the desired threshold voltage.

Therefore, according to the present manufacturing method, the characteristic adjustment annealing process is performed with the annealing process power calculated in the way described above. Accordingly, a variation in the threshold voltage of the product transistors 10 can be suppressed so that the production yield of the semiconductor device can be improved.

Moreover, the characteristic adjustment annealing process can achieve only the following: the threshold voltage can be lowered, and the drain current can be increased. Accordingly, in the annealing process (first annealing process) of the present manufacturing method, the annealing process power is suppressed such that the threshold voltage is increased to be higher than the desired threshold voltage and the drain current is decreased to be smaller than the desired drain current.

As a result, it is possible to prevent the threshold voltage of the product transistors 10 from becoming lower than the desired threshold voltage and prevent the drain current from being larger than the desired drain current before the characteristic adjustment annealing process (second annealing process) is performed.

Next, positions where the product transistors 10 and the inspection transistor 20 are formed will be described with reference to FIG. 4. FIG. 4 is a diagram illustrating an arrangement of the inspection transistor 20 and the product transistors 10 according to the embodiment. Here, an upper portion of FIG. 4 illustrates a wafer 50 on which the inspection transistor 20 and the product transistor 10 are embedded.

Moreover, a lower portion of FIG. 4 illustrates an enlarged schematic view of a chip 51 in the wafer 50. In the figure shown at the lower portion of FIG. 4, circuit elements other than the product transistors 10 and the inspection transistor 20 are not shown.

A plurality of chips 51 are formed in the wafer 50 as illustrated at the upper portion of FIG. 4. Moreover, the product transistors 10 are formed in the respective chips 51 as illustrated at the lower portion of FIG. 4. Moreover, dicing lines 52 to serve as cutting lines when cutting out the wafer 50 into each chip 51 are provided between the chips 51. The inspection transistor 20 is formed on the dicing line 52 or within the chip 51 in the present manufacturing method.

As such, since the inspection transistor 20 can be formed on the dicing line 52, the areas within the chips 51 can be efficiently used as areas for forming semiconductor devices. Accordingly, the inspection transistors 20 can be formed without obstructing the integration of the semiconductor devices.

Moreover, when the inspection transistor 20 is formed in the chip 51, the inspection transistor 20 is formed near the product transistors 10. As a result, the inspection transistor 20 and the product transistors 10 can be formed in substantially the same processing environment. Therefore, according to the present manufacturing method, it becomes possible to measure the characteristic of the inspection transistor 20 in which the characteristic of the product transistors 10 is reflected.

Figure 5A:
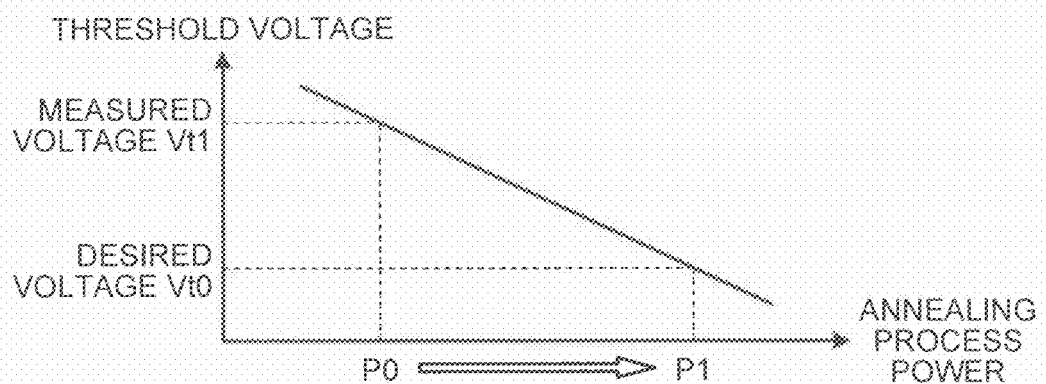
FIGS. 5A and 5B are diagrams illustrating a method of determining process conditions for performing a characteristic adjustment annealing process according to the embodiment.
Figure 5B:
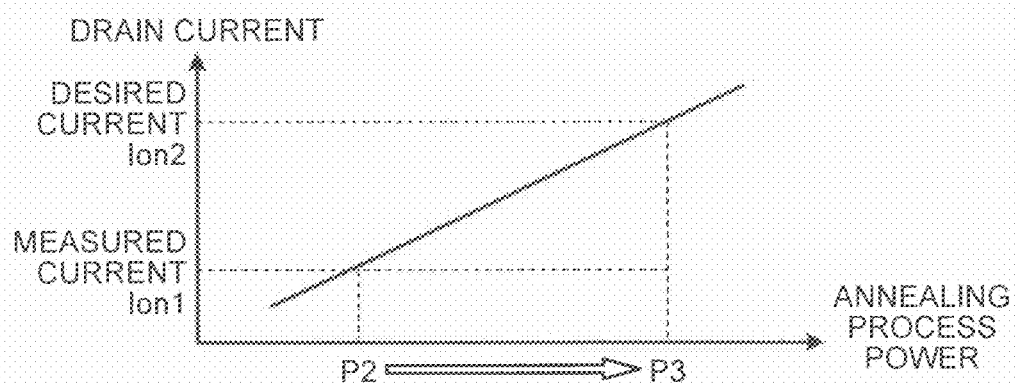

Next, a technique of determining processing conditions of the characteristic adjustment annealing process according to the embodiment is described. FIGS. 5A and 5B are diagrams illustrating the technique of determining the processing conditions of the characteristic adjustment annealing process according to the embodiment. FIG. 5A illustrates the technique of determining the processing conditions when the threshold voltage is measured as a characteristic of the inspection transistor 20. FIG. 5B illustrates the technique of determining the processing conditions when the drain current is measured as a characteristic of the inspection transistor 20.

When the threshold voltage of the inspection transistor 20 is measured as a characteristic of the inspection transistor 20 after the inspection salicide process is performed, a function that shows the correlation of the annealing process power and the threshold voltage is calculated in advance. Here, the correlation of the annealing process power and the threshold voltage is represented by the function in which the threshold voltage decreases as the annealing process power increases as illustrated in FIG. 5A.

Here, as described above, in the present manufacturing method, the annealing process power at the time when the annealing process is performed is weakened so that the threshold voltage of the inspection transistor 20 measured after the inspection salicide process is performed becomes higher than the desired threshold voltage.

Therefore, when the threshold voltage of the inspection transistor 20 is measured after the inspection salicide process, a threshold voltage (hereafter, referred to as "measured voltage Vt1") that is higher than the desired threshold voltage (hereafter, referred to as "desired voltage Vt0") is measured.

At this time, it is assumed that the annealing process power for performing the annealing process was P0. In such a case, in the present manufacturing method, the annealing process power for performing the characteristic adjustment annealing process is determined to be P1 that is higher than P0, based on the function shown in FIG. 5A, so that the threshold voltage of the product transistor 10 may be lowered by a difference between measured voltage Vt1 and the desired voltage Vt0.

On the other hand, when the drain current of the inspection transistor 20 is measured as a characteristic of the inspection transistor 20 after the inspection salicide process is performed, a function that shows the correlation of the annealing process power and the drain current is calculated in advance. Here, the correlation of the annealing process power and the drain current is represented by the function in which the drain current increases as the annealing process power increases as shown in FIG. 5B.

Here, as described above, in the present manufacturing method, the annealing process power for performing the annealing process is lowered so that the drain current of the inspection transistor 20 after the inspection salicide process may become smaller than the desired drain current.

Therefore, when the drain current of the inspection transistor 20 is measured after the inspection salicide process is performed, a drain current (hereafter, referred to as "measured current Ion1") that is smaller than the desired drain current (hereafter, referred to as "desired current Ion2") is measured.

In such a case, it is assumed that the annealing process power for performing the annealing process was P2. In the present manufacturing method, the annealing process power for performing the characteristic adjustment annealing process is determined to be P3 that is higher than P2 so that the drain current of the product transistor 10 may be increased by a difference between the desired current Ion2 and the measured current Ion1 based on the function shown in FIG. 5B.

Figure 6A:
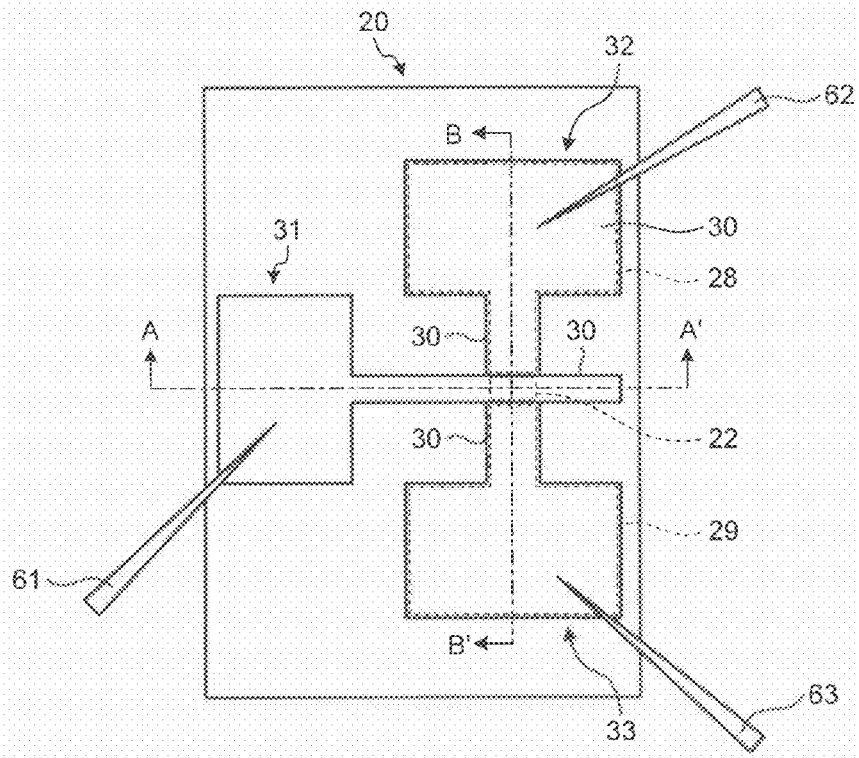
FIG. 6A is a diagram illustrating a method of measuring characteristics of the transistor for inspection according to the embodiment.

Next, a method of measuring a characteristic of the inspection transistor 20 according to the embodiment will be described using FIGS. 6A, 6B, and 6C. FIG. 6A is a diagram illustrating the method of measuring the characteristic of the inspection transistor 20 according to the embodiment. FIG. 6A is a schematic plan view which illustrates the inspection transistor 20 on which a silicide layer 30 is formed through the inspection salicide process, which is a view viewed from the surface side of the semiconductor substrate 1.

Figure 6B:
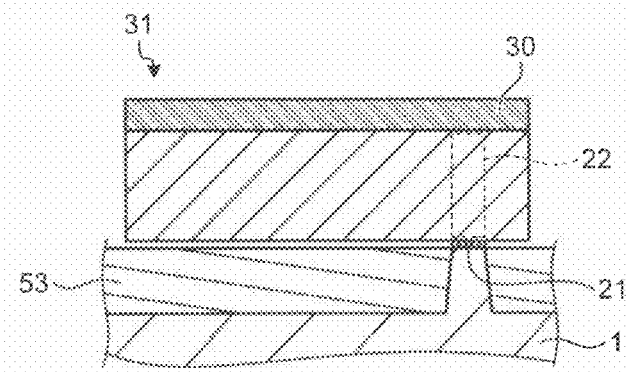
FIG. 6B is a schematic cross-sectional view of the transistor for inspection according to the embodiment taken along a line A-A' in FIG. 6A.
Figure 6C:
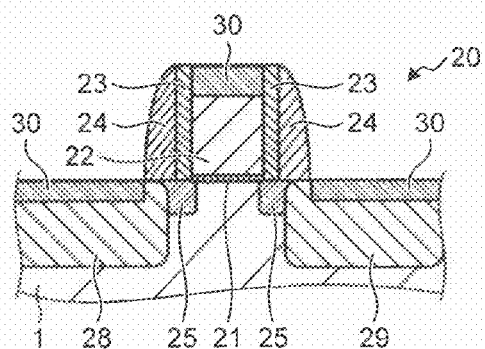
FIG. 6 C is a schematic cross-sectional view of the transistor for inspection according to the embodiment taken along a line B-B' in FIG. 6A.

FIG. 6B is a schematic cross-sectional view of the inspection transistor 20 according to the embodiment which is taken along a line A-A' in FIG. 6A, and FIG. 6C is a schematic cross-sectional view of the inspection transistor 20 according to the embodiment which is taken along a line B-B' in FIG. 6A.

As illustrated in FIG. 6B, in the present manufacturing method, a Shallow Trench Isolation (STI) 53 formed of a silicon oxide is formed in advance between active areas of the inspection transistor 20 and other circuit elements adjacent to the active areas before the inspection salicide process is formed.

In the inspection salicide process, as illustrated in FIGS. 6A and 6B, when the silicide layer 30 is formed on the gate 22 of the inspection transistor 20, this silicide layer 30 is also formed to extend over areas located outside the active areas of the inspection transistor 20.

Then, a gate pad for inspection 31 that is formed of the same silicide material is formed in the same layer as the silicide layer 30 at the same time when the silicide layer 30 is formed such that the gate pad 31 is connected to a leading end of the extended silicide layer 30. This gate pad for inspection 31 is formed such that its surface area may be larger than an area of the silicide layer 30 on the active area.

Moreover, when the silicide layer 30 is formed on the source 28 and the drain 29 of the inspection transistor 20 as shown in FIG. 6A and FIG. 6C at the same time as the gate pad for inspection 31, this silicide layer 30 is formed to extend over an area outside the active area of the inspection transistor 20.

In addition, a source pad for inspection 32 and a drain pad for inspection 33, which are formed of the same silicide, are formed in the same layer and at the same time as the silicide layer 30 such that it is connected to a leading end of the extended silicide layer 30. For this case, the source pad 32 and the drain pad 33 are formed to have a larger area than the silicide layer 30 on the active area.

Subsequently, in the present manufacturing method, the characteristic of the inspection transistor 20 is measured after the inspection salicide process is performed. Specifically, a probe for gate 61 is first brought into contact with the gate pad 31, a probe for source 62 is brought into contact with to source pad 32, and a probe for drain 63 is brought into contact with the drain pad 33.

When the threshold voltage is measured as a characteristic of the inspection transistor 20, predetermined different voltages are respectively applied to the probe for source 62 and the probe for drain 63. Subsequently a voltage applied to the probe for gate 61 is gradually increased, and a voltage applied to the probe for gate 61 when a current flow between source and drain gets to be a defined number is measured as the threshold voltage.

On the other hand, when the drain current is measured as a characteristic of the inspection transistor 20, a predetermined voltage higher than the threshold voltage is applied to the probe for gate 61. Subsequently, respectively different predetermined voltages are applied to the probe for source 62 and the probe for drain 63, and a current that flows between the probe for source 62 and the probe for drain 63 is measured as the drain current.

In this way, in the present manufacturing method, the gate pad 31, the source pad 32, and the drain pad 33 that are wider than the surface area of the silicide layer 30 on the active areas are formed outside the active areas of the inspection transistor 20.

As a result, the probe for gate 61, the probe for source 62, and the probe for drain 63 can be correspondingly brought into contact with the gate pad 31, the source pad 32, and the drain pad 33 easily and accurately.

Moreover, since all of the gate pad 31, the source pad 32, and the drain pad 33 are made of a silicide layer, that is, in a metallic state, the gate pad 31, the source pad 32, and the drain pad 33 are significantly low in electrical resistance than the gate 22, the source 28, and the drain 29 which have not yet undergone the inspection salicide process.

As a result, in the present manufacturing method, the threshold voltage and the drain current can be measured more accurately than the case in which the probe for gate 61, the probe for source 62, and the probe for drain 63 are brought into contact with the gate 22, the source 28, and the drain 29 that have not yet undergone the inspection salicide process.

Figure 7A:
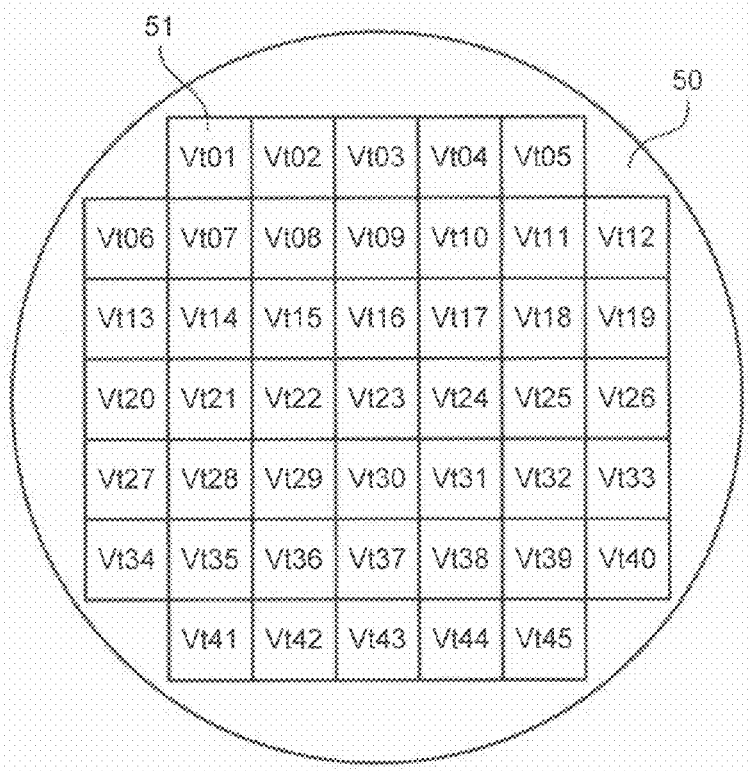
FIGS. 7A and 7B are diagrams illustrating an example of settings of a desired voltage concerning a threshold voltage of the transistor for product according to the embodiment.
Figure 7B:
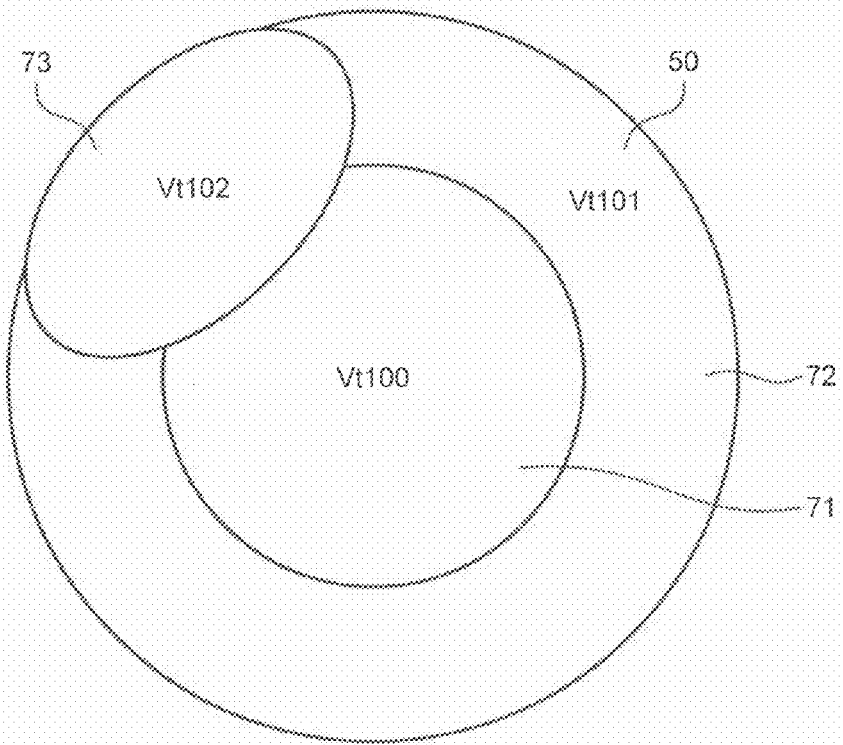

Next, an example of setting a desired voltage concerning the threshold voltage of the product transistor 10 according to the embodiment is described. FIGS. 7A and 7B are diagrams illustrating examples of setting the desired voltage concerning the threshold voltage of the product transistor 10 according to the embodiment.

In the present manufacturing method, the desired voltage concerning the threshold voltage can be set for each of the chips 51 formed in the wafer 50. For example, when forty-five chips 51 are formed on the wafer 50 as illustrated in FIG. 7A, desired voltages Vt01 to Vt45 can be set for the chips 51, respectively. In such a case, the characteristic adjustment annealing process suitable for each of the chips 51 can be performed with the annealing process powers that are determined based on the desired voltages Vt01 to Vt45 set to the chips 51, respectively.

As a result, according to the present manufacturing method, since the threshold voltage of the product transistor 10 can be adjusted in units of a chip 51 without depending on the distribution of the threshold voltages in the wafer 50, the production yield of the semiconductor devices can be improved by suppressing a variation in the threshold voltage between the chips 51.

Moreover, according to the present manufacturing method, the surface of the wafer 50 can be divided into a plurality of segmented regions, and a desired voltage concerning the threshold voltage can be set for each of the segmented regions. For example, it is assumed that there is a difference in the threshold voltage among a central area 71, a periphery area 72, and a partial peripheral area 73 in the wafer 50, as shown in FIG. 7B.

In such a case, in the present manufacturing method, it is assumed that a desired voltage of Vt100 is set to the central area 71 of the wafer 50, a desired voltage of Vt101 is set to the periphery area 72 of the wafer 50, and a desired voltage of Vt102 is set to the partial periphery area 73.

And, the characteristic adjustment annealing process for each segmented region is performed with the annealing process powers that are set based on the respective desired voltages Vt100, Vt101, and Vt102. As a result, the processing time required for completing the adjustment of the threshold voltages of all chips 51 can be shortened as well the variation in the threshold voltage among all product transistors 10 can be reduced.

When the drain current is measured as the characteristic of the inspection transistor 20, a desired current concerning the drain current of the product transistor 10 may be set for each of the chips 51 or each of the segmented areas in the wafer 50. The desired voltage and the desired current may be set for each of the wafers 50 or each Lot number of the semiconductor devices.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:
   (A) performing an annealing process that activates a source and a drain of an inspection transistor and a source and a drain of a product transistor, both of which are formed on a semiconductor substrate;
   (B) performing silicidation on a gate, the source, and the drain of the inspection transistor having undergone the (A) performing;
   (C) measuring a characteristic of the inspection transistor having undergone the (B) performing;
   (D) performing a characteristic adjustment annealing process that makes a characteristic of a product transistor close to a desired characteristic, based on a difference between the desired characteristic and the characteristic measured by the (C) measuring; and
   (E) performing silicidation on a gate, the source, and the drain of the product transistor having undergone the (D) performing.

2. The method of manufacturing a semiconductor device according to claim 1,
   wherein the characteristic of the inspection transistor is a threshold voltage of the transistor, and
   wherein the (A) performing includes performing the annealing process such that the threshold voltage becomes higher than a desired threshold voltage after the (B) performing.

3. The method of manufacturing a semiconductor device according to claim 1,
   wherein the characteristic of the inspection transistor is a current that flows between the source and the drain of the transistor when a predetermined voltage is applied to the gate of the transistor, and
   wherein the (A) performing includes performing the annealing process such that the current becomes smaller than a desired current after the (B) performing.

4. The method of manufacturing a semiconductor device according to claim 1,
   wherein the inspection transistor is provided on a dicing line of the semiconductor substrate.

5. The method of manufacturing a semiconductor device according to claim 1, wherein the inspection transistor is provided near the product transistor within a chip surrounded by dicing lines in the semiconductor substrate.

6. The method of manufacturing a semiconductor device according to claim 1,
wherein, the (A) performing includes performing the annealing process using laser annealing or flash annealing of relatively weak power compared to when the characteristics of the inspection transistor and the product transistor are made to become the desired characteristics, after the (B) performing.

7. The method of manufacturing a semiconductor device according to claim 1, further comprising:
(F) forming an inspection pad at a position outside active areas of the inspection transistor in such a manner that the inspection pad is connected to each of the silicided gate, the silicided source, and the silicided drain of the inspection transistor and the inspection pad has an area larger than that of each of the gate, the source, and the drain of the inspection transistor.

8. The method of manufacturing a semiconductor device according to claim 7,
wherein the inspection pad is subjected to silicidation at the same time when the gate, the source, and the drain of the inspection transistor are subjected to silicidation.

9. The method of manufacturing a semiconductor device according to claim 1, further comprising:
(G) setting the desired characteristic for each of the chips surrounded by dicing lines or for each of segmented regions in the semiconductor substrate.

* * * * *